US010826501B1

(12) United States Patent
Coban et al.

(10) Patent No.: US 10,826,501 B1
(45) Date of Patent: Nov. 3, 2020

(54) RING OSCILLATOR BASED RC CALIBRATION CIRCUIT

(71) Applicant: Silicon Laboratories Inc., Austin, TX (US)

(72) Inventors: Abdulkerim L. Coban, Austin, TX (US); Wenhuan Yu, Austin, TX (US); Mustafa H. Koroglu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/450,083

(22) Filed: Jun. 24, 2019

(51) Int. Cl.
*H03L 7/08* (2006.01)
*H03K 21/00* (2006.01)
*H03K 3/03* (2006.01)
*H03L 7/099* (2006.01)
*H03H 11/04* (2006.01)
*H03H 11/12* (2006.01)

(52) U.S. Cl.
CPC ....... *H03L 7/0805* (2013.01); *H03H 11/0472* (2013.01); *H03H 11/1291* (2013.01); *H03K 3/0315* (2013.01); *H03K 21/00* (2013.01); *H03L 7/0995* (2013.01); *H03H 2210/04* (2013.01); *H03H 2210/043* (2013.01)

(58) Field of Classification Search
CPC ..... H03L 7/0805; H03L 7/099; H03K 3/0315; H03H 11/1291; H03H 11/0472; H03H 2210/04; H03H 2210/043; H03H 2210/046; H03H 11/265
See application file for complete search history.

(56) References Cited

U.S. PATENT DOCUMENTS

| | | | |
|---|---|---|---|
| 6,765,446 B2 * | 7/2004 | Arp | H03L 7/091 331/1 A |
| 8,364,433 B1 * | 1/2013 | Keramat | H03H 11/1291 702/107 |
| 9,425,762 B2 * | 8/2016 | Kovac | H03H 7/12 |
| 2002/0149087 A1 * | 10/2002 | Okada | H03H 11/265 257/533 |

OTHER PUBLICATIONS

Abdulrazzaq, B., et al., "A Review on High-Resolution Cmos Delay Lines: Towards Sub-Picosecond Jitter Performance," SpringerPlus, 2016, pp. 1-32.
Al-Asali, M., "An On Chip All-Digital Configurable Clock Generator for ASICs' AT-Speed Testing," Thesis to Deanship of Graduate Studies King Fahd University of Petroleum & Minerals, Jan. 2013, 130 pages.
Elrabaa, M., "A Portable High-Frequency Digitally Controlled Oscillator (DCO)," Integration, the VLSI Journal, 2013, 8 pages.
Pavan, S., et al., "Understanding Delta-Sigma Data Converters," John Wiley & Sons, 1997, pp. 271-273.

* cited by examiner

*Primary Examiner* — Ryan Johnson
(74) *Attorney, Agent, or Firm* — Zagorin Cave LLP (57) ABSTRACT

A calibration operation adjusts a frequency of a ring oscillator to a desired frequency by adjusting programmable RC circuits in the stages of the ring oscillator. The programmable RC circuits have programmable capacitors, resistors, or both. The RC circuits account for most of the delay through the ring oscillator. Another circuit with its own RC time constant is calibrated based on the adjustments made to the RC circuits in the ring oscillator to achieve the desired frequency.

20 Claims, 6 Drawing Sheets

RING OSCILLATOR BASED RC CALIBRATION CIRCUIT

BACKGROUND

Field of the Invention

This application relates to calibration of circuits and more particularly to use of a ring oscillator in calibrating circuits.

Description of the Related Art

Many analog circuits rely on the product of resistor and capacitor values, typically referred to as an RC time-constant. Active-RC filters, continuous-time delta-sigma analog-to-digital convertors (ADCs), phase-locked loop (PLL) loop-filters, and relaxation oscillators are some of the circuits that require an accurate value of their RC time constants. The RC time constant sets parameters such as bandwidth of a filter, loop-filter characteristics of a continuous delta-sigma ADC, and oscillation frequency of a relaxation oscillator.

However, the RC time-constant varies across process and temperature and, therefore often needs to be tuned (or calibrated) to be at its nominal value. There are many ways of calibrating an RC time constant. One solution uses a switched capacitor circuit and requires a large capacitor to filter the ripple caused by the switched capacitor circuit and requires an accurate comparator.

Another technique charges a capacitor with a current proportional to 1/R (where both R and C are of the type that are used in the circuit that needs to be calibrated) and measuring the time required for the capacitor to reach a certain voltage. The capacitor value is adjusted until the target time (and therefore the desired nominal value) is reached. Circuits implementing these techniques are, however, analog intensive, and therefore suffer from mismatch effects. Such circuits also tend to be large in area and not easily portable across processes.

Accordingly, improved calibration approaches are desirable to overcome some of the drawbacks of analog intensive solutions.

SUMMARY OF EMBODIMENTS OF THE INVENTION

In an embodiment, a method of performing a calibration operation includes operating a ring oscillator with adjustable RC time constants in respective stages of the ring oscillator and adjusting the adjustable RC time constants until an oscillation frequency of the ring oscillator is at a desired frequency. The RC time constants having a final value when the oscillation frequency is at the desired frequency. Another RC time constant in another circuit is adjusted based on the final value of the RC time constants.

In another embodiment an integrated circuit includes a ring oscillator with an odd number of inverter stages. Each of the inverter stages includes an inverter and an RC circuit having an adjustable RC time constant. A calibration controller adjusts the adjustable RC time constant of each inverter stage until an oscillation frequency of the ring oscillator is at a desired oscillation frequency. A second circuit that is independent of the ring oscillator and has a variable circuit parameter that is calibrated based on adjustments made to the adjustable RC time constant of each inverter stage to achieve the desired oscillation frequency.

In another embodiment an integrated circuit includes a ring oscillator including a plurality of inverting stages having respective programmable capacitor circuits disposed in each of the inverting stages. A calibration controller measures an oscillation frequency of the ring oscillator and adjusts the respective programmable capacitor circuits until the oscillation frequency is at a desired oscillation frequency. A functional circuit is independent of the ring oscillator and has a variable capacitor and the variable capacitor is calibrated based on adjustments made to the programmable capacitor circuits to achieve the desired oscillation frequency.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

In embodiments the RC time constant of various circuits in an integrated circuit are calibrated using a calibration circuit that includes an RC programmable ring oscillator. The use of the ring oscillator allows the calibration circuit to provide significant area savings as compared to prior approaches. In addition, embodiments are highly digital nature making the calibration solution easily portable to other processes and designs with minimal change. The change simply modifies Rs and/or Cs with those of the other processes and designs that need RC time constant calibration. In addition, the ring oscillator calibration approach is easily adaptable to different RC time constants required for different circuits within an integrated circuit.

Embodiments of the calibration approach described herein utilize a programmable RC oscillator and the calibration is performed in the time domain. The time domain calibration scheme described herein can operate with a wide range of reference frequencies. In an embodiment, calibrating to a different reference frequency entails loading a different start value for the down-counter (described further herein) corresponding to the new reference frequency. In addition, the circuit is also highly insensitive to offset and mismatch effects that typically limit the calibration accuracy of more analog intensive calibration circuits.

Figure 1:
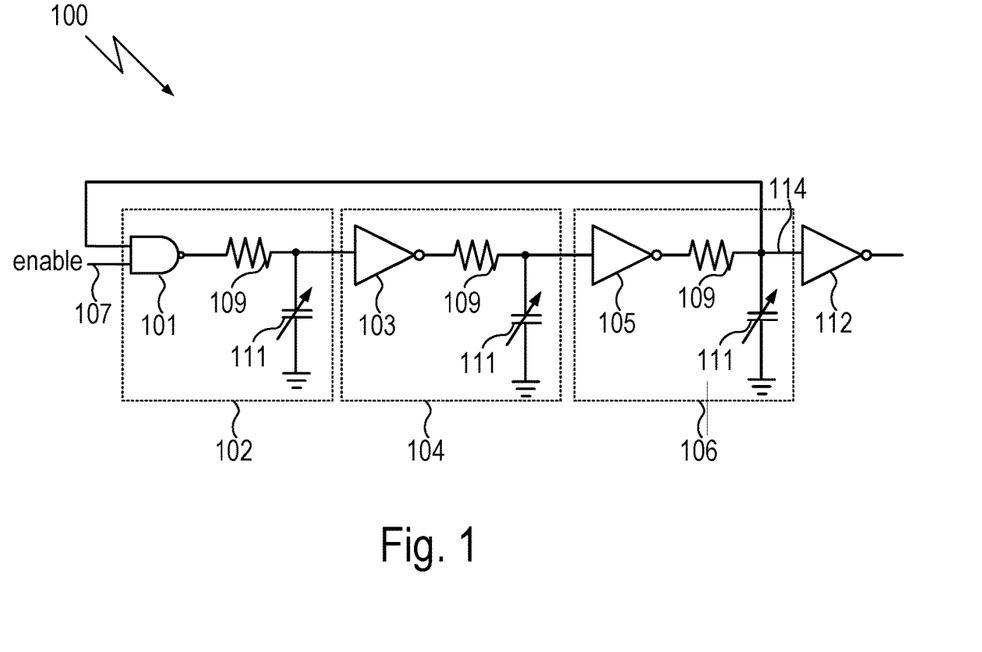
FIG. 1 illustrates an embodiment of a ring oscillator used in calibration.

Referring to FIG. 1, a ring oscillator 100 provides one part of the calibration circuit. The ring oscillator includes inverters 101, 103, and 105. Embodiments include an additional inverter 112 coupled to the oscillator output 114. The first inverter stage 101 utilizes a NAND structure and receives an enable signal 107. An RC circuit resides between each inverter that includes a fixed resistor 109 and a variable capacitor 111. Note that in other embodiments, the resistor may be variable (with or without the variable capacitor) so the time constant can be adjusted by varying the resistance. The frequency of the RC ring oscillator (fosc) decreases when the RC time constant increases and the frequency of the RC ring oscillator increases with a lower RC time constant. The delay through each stage 102, 104, and 106 of the ring oscillator determines the oscillation frequency. In the illustrated embodiment, the time delay due to the RC time constant dominates. The RC delay is made much larger than the delay associated with the inverters to ensure that the oscillation frequency is primarily determined by the RC time constant. For example, in embodiments, the RC time constant contributes 99% of the delay in the ring oscillator while the delay through the inverters contributes approximately 1%. Thus, the nominal value of the RC time constant is chosen such that the oscillation frequency of the ring oscillator is determined mostly by the delay associated with the RC network. The delay associated with the active elements (e.g., inverters) is kept relatively small. Typically, the delay associated with the active elements is at most several percent of the total delay at nominal values of the RC time constant and therefore the RC time constant delay dominates the active element delay in each stage.

In the embodiment of FIG. 1 the RC time constant is calibrated by adjusting the programmable capacitors 111 and by comparing fosc to a desired frequency using an accurate reference clock signal, which is readily available in many systems, particularly wireless systems. In an embodiment, the comparison is performed by counting the number of pulses of the reference clock signal that occur in a predetermined number of periods (one or more) of the ring oscillator output signal. If the count equals the expected count for the nominal value, the RC time constant is at its nominal value. If the count is below the expected count value, the period of the ring oscillator is too short (frequency too fast) so the RC time constant is increased to slow down the oscillation frequency. If the count is above the expected count value, the period of the ring oscillator is too long (frequency too slow) so the RC time constant is decreased to speed up the oscillation frequency.

Figure 2:
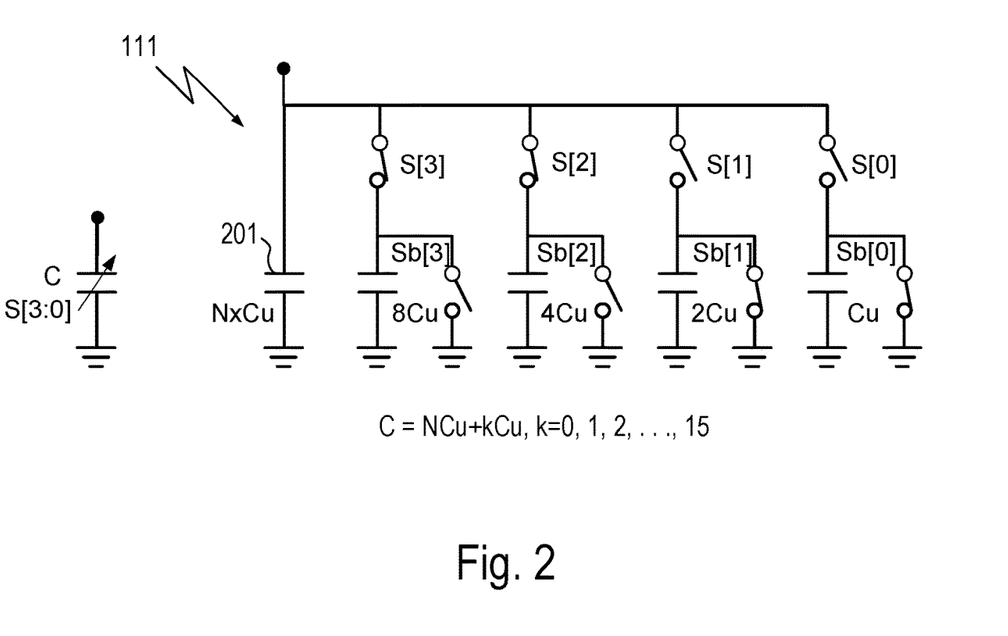
FIG. 2 illustrates an embodiment of a programmable capacitor usable in a ring oscillator.

FIG. 2 illustrates an example of a four bit digitally programmable capacitor 111 programmed by a 4 bit value S[3:0]. The variable capacitor includes a fixed capacitor 201 implemented with N unit capacitors having a value of N×Cu where Cu represents capacitive units, e.g., pF. The four bits program the capacitance through switches with control signals S[3], S[2], S[1], S[0] (and their complement Sb[x]). C=NCu+kCu, where k=0, 1, 2, . . . , 15. With N=16, the capacitance value of C can take the values from 16Cu to 31Cu. In the example shown in FIG. 2, S[3:0]=1100 so C=28Cu. Thus, the time constant of each RC circuit is adjustable to speed up or slow down the oscillation frequency of the ring oscillator as desired.

Figure 3:
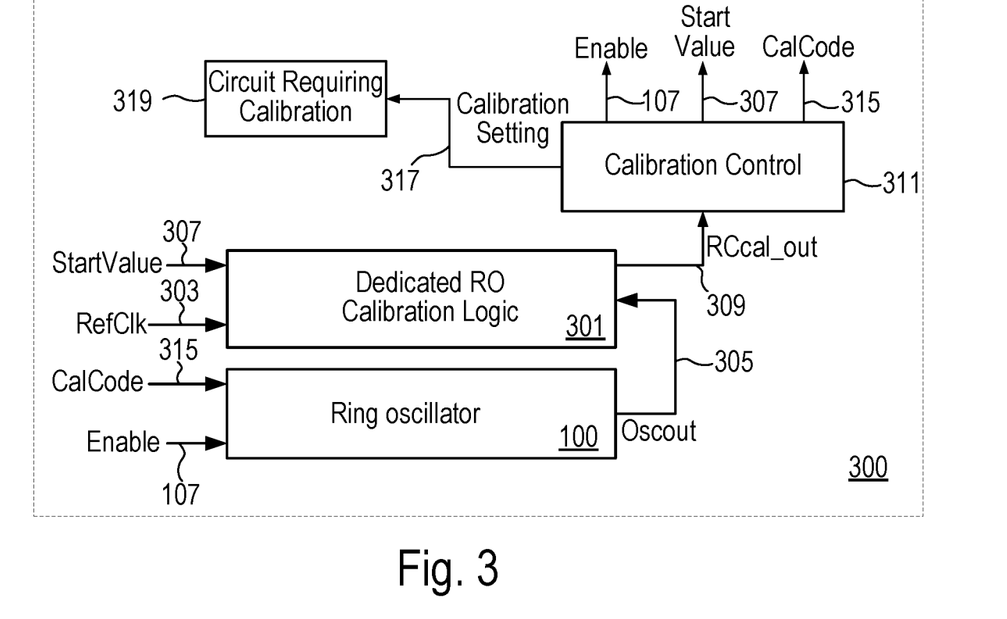
FIG. 3 illustrates an embodiment that includes a ring oscillator and dedicated calibration logic used in calibrating the ring oscillator to a desired frequency.

FIG. 3 illustrates an embodiment of an integrated circuit 300 that includes the ring oscillator 100 and dedicated ring oscillator (RO) calibration logic 301. The dedicated RO calibration logic 301, an embodiment of which is described further herein, compares the output frequency of the ring oscillator (Oscout) 305 to a target frequency using the reference clock 303 to determine if the ring oscillator frequency is above or below the target frequency. The start value 307 specifies the target frequency. The dedicated RO calibration logic 301 supplies a calibration output signal RCcal_out 309 to a higher level calibration control circuit 311. The RCcal_out signal indicates whether the RC ring oscillator is oscillating faster or slower than the target frequency. The calibration control circuit 311 controls the overall calibration operation and supplies the calibration code (CalCode) 315 to the ring oscillator 100 that determines the RC time constant of the ring oscillator. The calibration code 315 is shown as S[3:0] in the embodiment of FIG. 2. The higher level calibration control circuit 311 also supplies the enable signal 107 (see FIG. 1) to the ring oscillator and the start value 307 to the dedicated RO calibration logic 301. The calibration control circuit 311 (or another calibration circuit) provides the calibration setting 317 to set the RC time constant of one or more other circuits 319 that require calibration in integrated circuit based on the calibration of the ring oscillator as described further herein. The higher level calibration control circuit 311 may be implemented, e.g., in a state machine, as a programmed microcontroller, or a combination of dedicated logic and programmable logic, including a microcontroller. The start value may be stored in non-volatile memory (NVM) along with calibration control programming. The one or more other circuits requiring calibration 319 may be, e.g., an active-RC filter, a continuous-time delta-sigma analog-to-digital converter, a PLL loop-filter, a relaxation oscillator, and/or any circuit that requires an accurate value of its RC time constant. Note that in embodiments the dedicated RO calibration logic 301 and the calibration control circuit 311, while shown as separate, may be combined as a single logic block.

Figure 4:
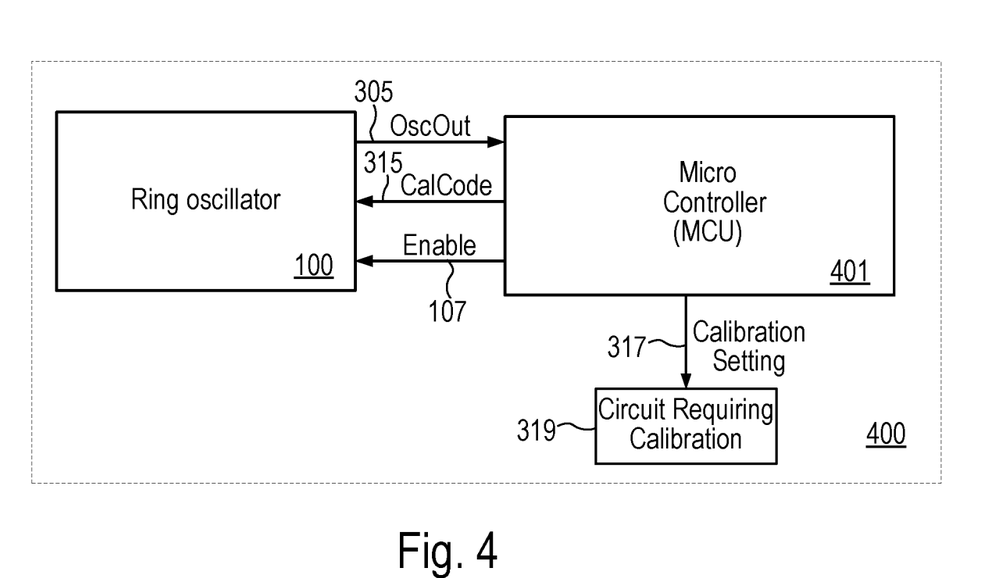
FIG. 4 illustrates an embodiment that includes a ring oscillator and a micro controller that controls the ring oscillator calibration operation.

FIG. 4 illustrates an embodiment of an integrated circuit 400 that includes the ring oscillator 100 and a microcontroller 401 that controls the calibration operation of ring oscillator 100. In the embodiment of FIG. 4, the microcontroller receives the oscillator output signal 305 and supplies the calibration code (CalCode) 315 and the enable signal 107. The microcontroller determines whether the ring oscillator is running fast or slow (based on a clock signal supplied to the microcontroller) and adjusts the calibration code accordingly. In the embodiment of FIG. 4, the microcontroller 401 also supplies the calibration setting 317 to the one or more other circuits requiring calibration 319, which may be, e.g., an active-RC filter, a continuous-time delta-sigma analog-to-digital convertor, a PLL loop-filter, a relaxation oscillator.

Note that the calibration control circuit 311 and the dedicated RO calibration logic 301 and/or the MCU 400 may be referred to herein generally as the calibration controller.

In embodiments, the ring oscillator core 100 is located close to the one or more other circuits 319 being calibrated to minimize process gradients that may occur across integrated circuits. In that way, the process variations affecting the capacitors and resistors in the ring oscillator 100 are more likely to be well matched to the process variations in the one or more other circuits requiring an accurate time constant. Similarly, resistors and capacitors used in the calibration circuit (ring oscillator), if possible, are implemented with the same unit resistors and capacitors employed in the circuit to be calibrated for better calibration accuracy.

Figure 5:
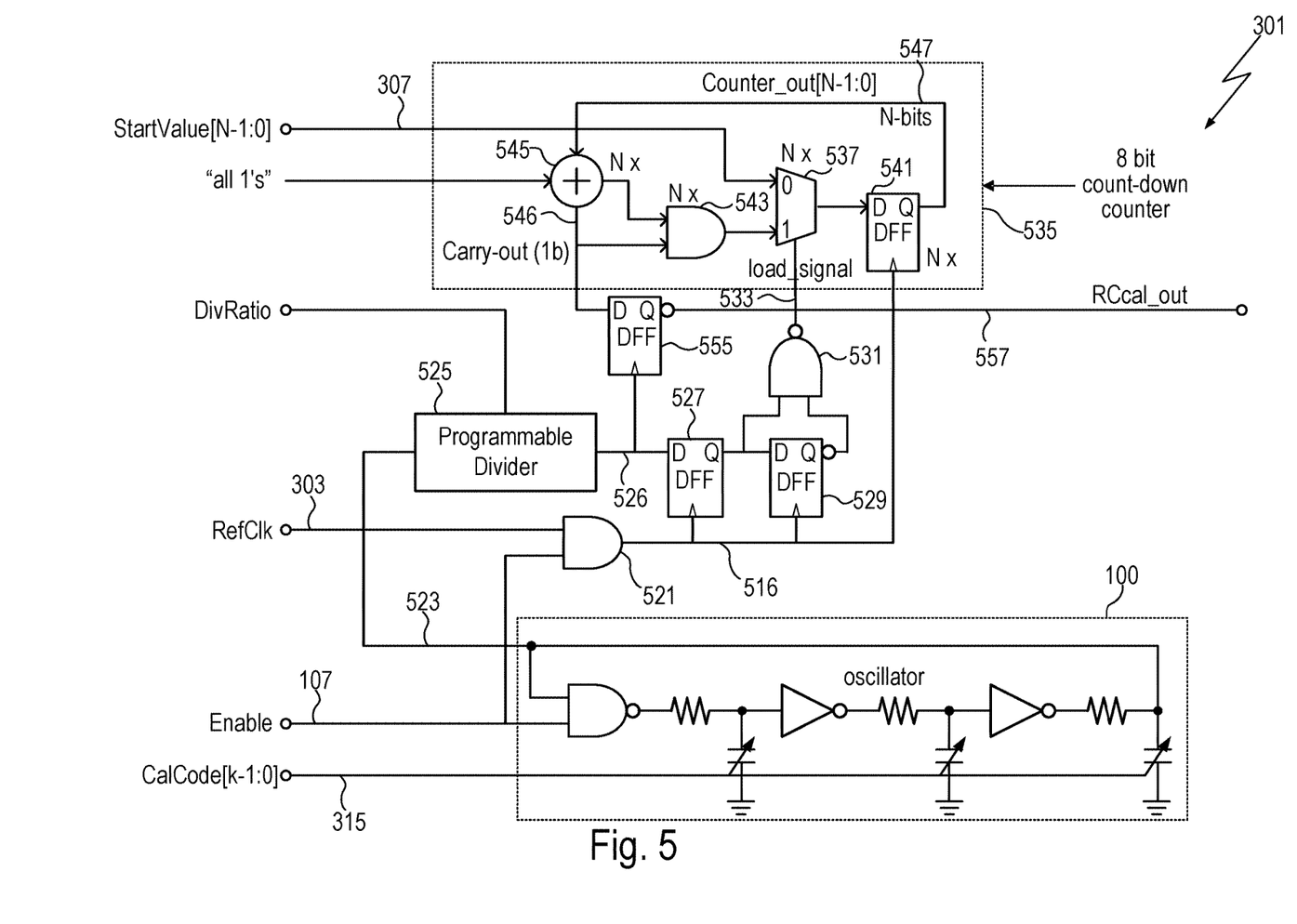
FIG. 5 illustrates an embodiment of dedicated calibration control logic used in calibrating the ring oscillator to a desired frequency.
Figure 6:
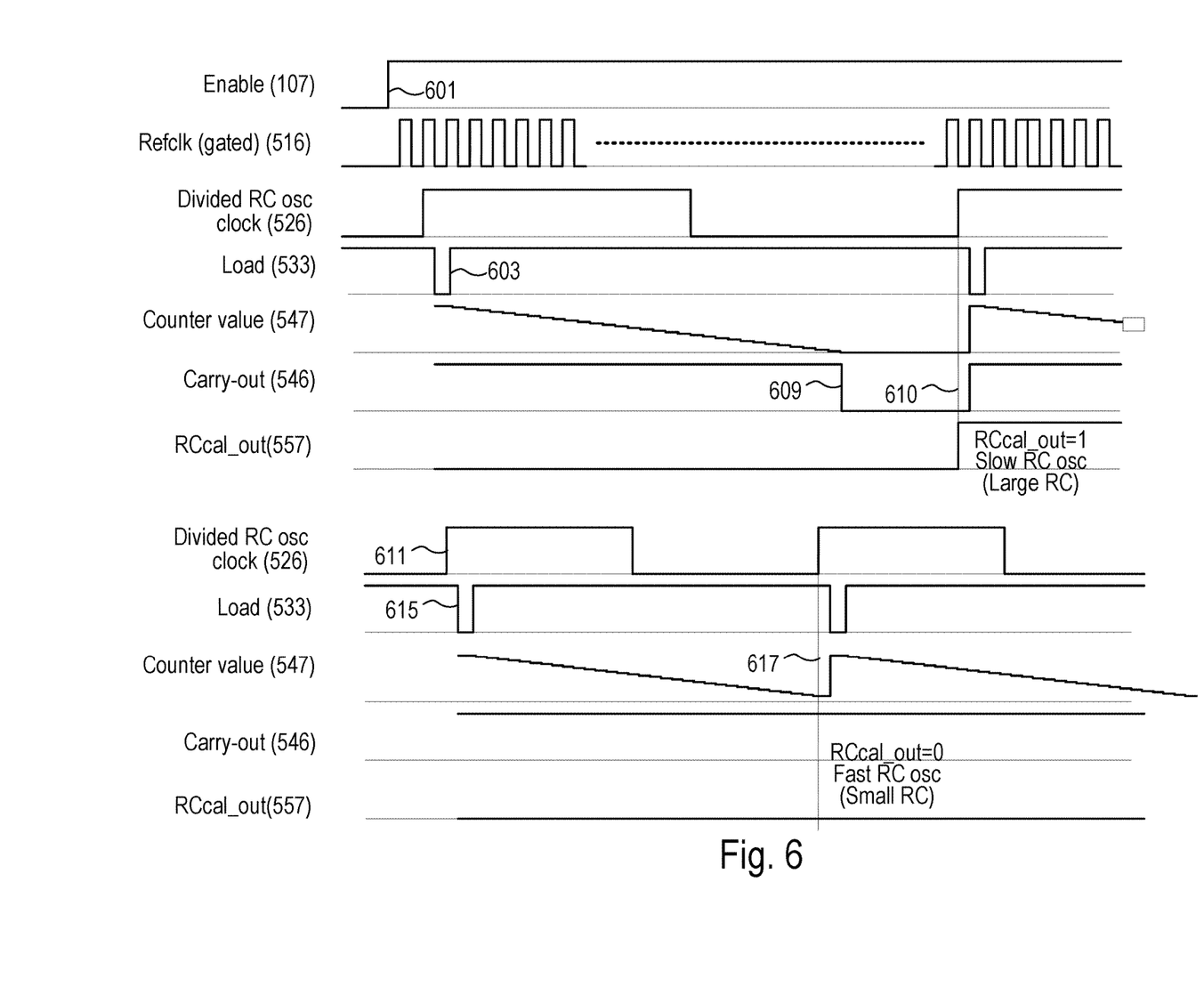
FIG. 6 illustrates a timing diagram showing operation of the dedicated calibration logic.

FIG. 5 illustrates an embodiment of the dedicated RO calibration logic 301 and the ring oscillator 100. FIG. 6 illustrates a timing diagram of the calibration operation with the dedicated RO calibration logic 301 and the ring oscillator 100. With reference to both FIGS. 5 and 6, when enable 107 is asserted at 601, the calibration operation begins and the ring oscillator 100 oscillates at a frequency determined by the calibration code (CalCode[k−1:0]) 315. The calibration code, as discussed, e.g., with relation to FIG. 2, controls the time constant of the ring oscillator. In one embodiment, the ring oscillator 100 oscillates at approximately 1 MHz with the calibration code set at mid-scale. Note that since the delay of each ring oscillator stage is dominated by that of the RC circuit, absent the RC circuits in the ring oscillator, the ring oscillator would oscillate at much higher frequencies; 100 MHz to GHz frequencies. The dedicated RO calibration control logic 301 receives an accurate reference clock signal (Refclk) 303, which in an embodiment has a frequency of approximately 300 MHz (or another suitable reference frequency) and is gated by the enable signal 107 in AND gate 521, which supplies gated reference clock signal 516. The output 523 of the ring oscillator is supplied to programmable divider 525. The output 526 of the programmable divider 525 supplies the D input of flip-flop 527. The Q output of flip-flop 527 supplies the D input of flip-flop 529 and NAND gate 531. The compliment of the Q output of flip-flop 529 supplies the other input of NAND gate 531, which in turns supplies a load pulse 533 for the down counter 535. The load pulse 533 selects the input for multiplexer 537 for one reference clock cycle to be the counter start value (StartValue[N−1:0]) 307, which is loaded into the flip-flops 541. Note the "Nx" in FIG. 5 indicates the counter is implementing an N bit down counter and therefore the signal width and the number of components is suitable to implement the N bit down counter. For example, for an 8 bit count-down counter, flip-flops 541 constitute eight D flip-flops (DFF).

Once the flip-flops 541 are loaded with the start value 307 based on load pulse 533 being asserted at 603 in FIG. 6, the multiplexer 537 then selects the output of AND gates 543. The counter 535 receives "all 1s" (11111111 for N=8) to add to the outputs of flip-flops 541, which functions to subtract one from the flip-flops 541 each reference clock cycle. Summer 545 supplies the sum bits and the carry out bits to AND gates 543 to implement a conventional adder. The AND gate 543 ANDs together the carry out bit associated with the previous sum bit and the output of summer 545, which provides the bitwise summation of "all 1s" and the bits from flip-flops 541. The counter value 547 from flip-flops 541 is shown in FIG. 6 as decreasing towards 0. The carry-out 546 from the most significant bit is 1 until the counter reaches 0 and then goes low at 609. Flip-flop 555 loads the low value of carry-out 546 and supplies at 610 the asserted RCcal_out signal 557 on the rising edge of the divided clock signal 526 supplied by programmable divider 525.

The start value 307 of the counter corresponds to the expected count of reference clock periods in one cycle of the divided down oscillator output signal 526. If the down counter 535 reaches zero within the one cycle of the divided down oscillator output signal, indicated by RCcal_out 557 being 1, that indicates that the frequency of the RC ring oscillator is slow due to a large RC. The calibration controller 311 (see FIG. 3) or MCU 401 (see FIG. 4) responds to the frequency of the RC oscillator being too slow by adjusting the calibration code 315 to reduce the RC time constant to increase the frequency.

Referring to the bottom portion of FIG. 6, the divided down oscillator clock asserts at 611, resulting in the load pulse at 615 supplied by AND gate 531. The counter value is still counting down towards zero, but not reaching zero at 617, which is the rising edge of the divided down oscillator signal. The rising edge of the divided down oscillator signal at 617 loads flip-flop 555 with a carry-out value of 1 causing RCcal_out to be 0. The value 0 indicates that the ring oscillator frequency is too high (RC time constant too low).

Figure 7:
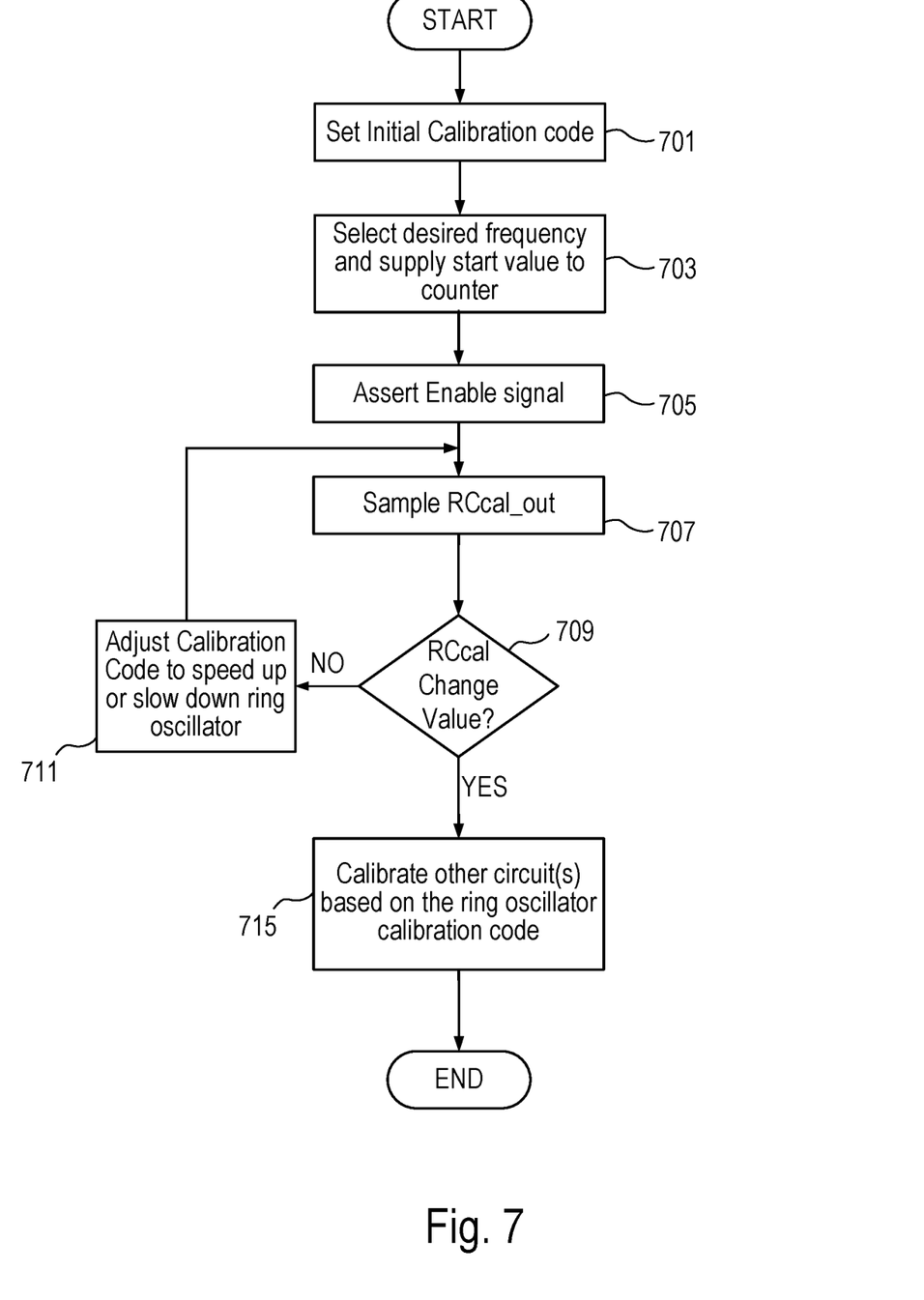
FIG. 7 illustrates a flow chart illustrating the calibration operation.

FIG. 7 illustrates an embodiment of a flow chart of the control logic to adjust the calibration code for the programmable capacitors in the ring oscillator such as control logic 311 (see FIG. 3) or MCU 401 (see FIG. 4). In 701 the control logic selects an initial calibration code to be midscale (or some other initial value). The control logic selects the desired frequency of the ring oscillator, based on the circuit parameters for circuit 319 that needs calibrating and the frequency of the reference clock. The desired frequency is encoded in the start value. The control logic also supplies the start value to the dedicated calibration control logic 307 in 703 or internal to the MCU and asserts the enable signal 107 in 705. In 707, the control logic samples the RCcal_out signal, which is updated on the rising edge of the divided down oscillator signal as shown in FIGS. 5 and 6. In 709 the control logic checks to see if the RCcal_out has changed value from the last time it was sampled (or if this was the first time RCcal_out was sampled). If the RCcal_out has not changed value (or if this is the first time) the control logic adjusts the calibration code in 711 to increase the time constant (if RCcal_out=1) or to decrease the time constant (if RCcal_out=0) and returns to sample the next RCcal_out in 707. If however, the control logic detects RCcal_out has changed from a 0 to 1 or 1 to 0, that means that the calibration code is at the desired value or as close as the code can get given the finite length of the calibration code and the fact the variable capacitor is adjusted in discrete steps. Note that if the calibration is performed by incrementing or decrementing the calibration code 1 LSB at each step and therefore the adjustments made to the programmable capacitors are made using the smallest adjustments possible, then once the value of RCcal_out toggles, the oscillation frequency is as close as it can be to the desired oscillation frequency. Thus, the oscillation frequency is considered to be at the desired oscillation frequency when the actual oscillation frequency is within an acceptable margin of error from the target frequency. The adjustments made to the RC time constant to achieve the desired frequency are then used in 715 to calibrate the other circuits in the integrated circuit needing calibration. For example, if the calibration code is S[3:0] and the nominal value is at S=1100, and the operation of the ring oscillator calibration sets the calibration code at 1011, then to calibrate the time constant of the other circuits(s), their calibration code is set at 1011 or a value based on the difference between the nominal calibration code value and the final calibration code value that achieves the desired frequency. A linear search (a simple increment/decrement of the calibration code) or binary search are the most common calibration code adjustment schemes.

Figure 8:
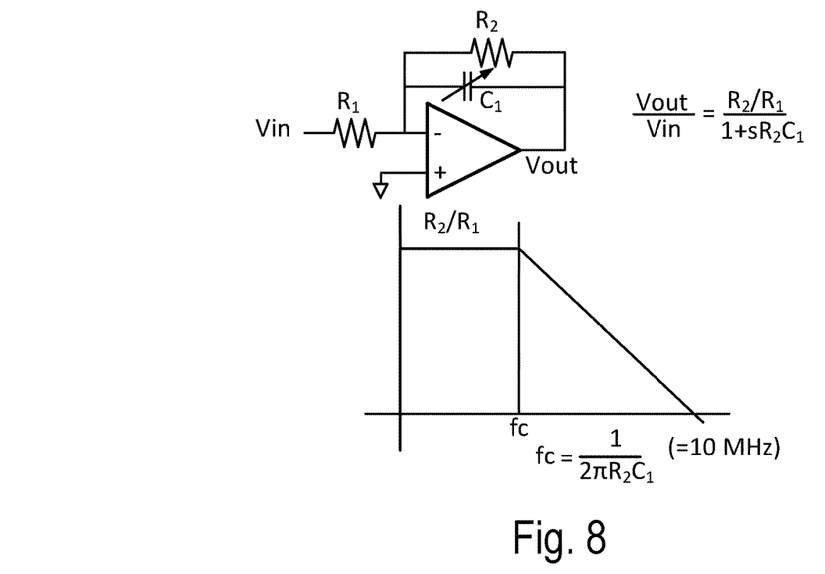
FIG. 8 illustrates an example of a low-pass filter circuit that is tuned based on the ring oscillator calibration operation.
Figure 9:
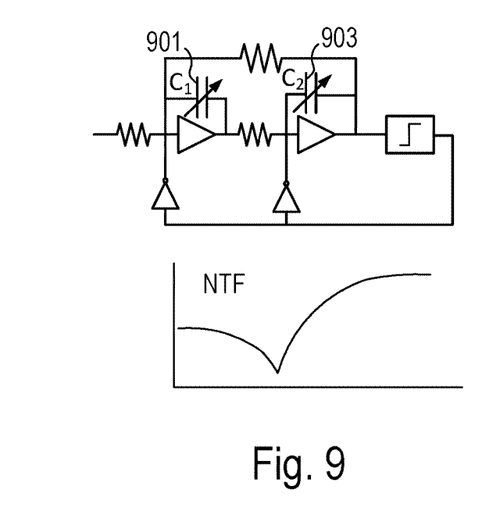
FIG. 9 illustrates an example of a simplified delta-sigma modulator circuit that is tuned based on the ring oscillator calibration operation.
Figure 10:
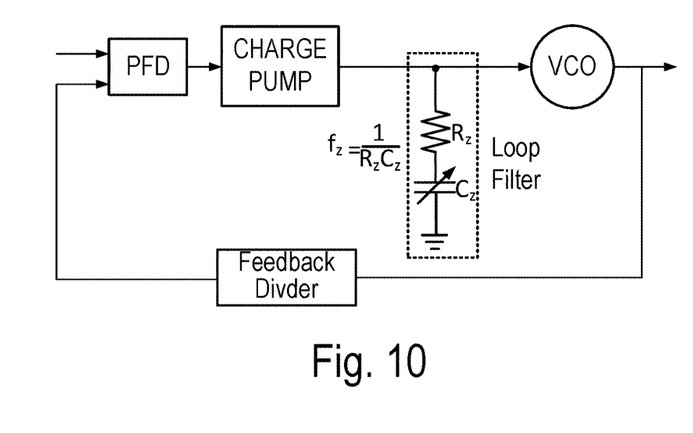
FIG. 10 illustrates an example of a loop filter of a phase-locked loop.

FIGS. 8, 9, and 10 give examples of circuits that require calibration. FIG. 8 illustrates a filter that has a corner frequency fc based on $R_2$ and $C_1$. As an example, the desired frequency characteristic of the filter requires that fc=10 MHz, where $$f_c = \frac{1}{2\pi R_2 C_1}.$$

That value corresponds to a particular frequency of the ring oscillator at nominal values of $C_1$. Thus, the start value 307 in FIG. 5 is selected based on the desired frequency characteristic of the circuit. When the ring oscillator oscillates at the desired frequency, the filter will have fc set where desired. Thus, $C_1$ in FIG. 8 is adjusted to match the adjustment made to the capacitors of the ring oscillator during calibration.

FIG. 9 illustrates an example of a second order delta-sigma modulator circuit that has variable capacitors 901 and 903 adjusted based on the calibration of the ring oscillator. The frequency of the ring oscillator is set such that when the oscillator is oscillating at that frequency, the desired delta-sigma modulator noise transfer function (NTF) is achieved by adjusting capacitors 901 and 903 in FIG. 9 based on the adjustment made to the ring oscillator capacitors during calibration to get the ring oscillator to oscillate at the target frequency.

FIG. 10 illustrates an example of a loop filter of a phase-locked loop that has a desired frequency loop filter zero-frequency $$f_z = \frac{1}{R_z C_z}.$$

The capacitor $C_z$ of the loop filter is adjusted based on the calibration of the ring oscillator to thereby calibrate the loop filter. While FIGS. 8-10 illustrate a few examples of circuits requiring calibration, other circuits can of course be calibrated based on calibration of the ring oscillator.

In another embodiment, a microcontroller or other control logic determines whether the frequency of the ring oscillator is fast or slow using a counter that counts up. For example, rather than use a down counter, a counter is used that counts up from zero using the reference clock signal for a predetermined number of ring oscillator clock cycles and at the end of the predetermined number of ring oscillator cycles the microcontroller or other control logic compares the counter value to an expected value. In this embodiment, the expected value corresponds to the target frequency of the ring oscillator. The counter may be internal or external to a microcontroller. If the counter value is too small compared to the expected value, the RC time constant is too low (frequency too high) and the microcontroller adjusts the ring oscillator capacitance to increase the RC time constant and if the counter value is too large, the RC time constant is too high (frequency too low), the micro controller decreases the RC time constant. The microcontroller or other control logic controls the calibration of the other circuits in the integrated circuit based on the calibration of the ring oscillator.

Thus, various aspects have been described related to calibrating circuits in an integrated circuit using a ring oscillator. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method of performing a calibration operation comprising:
    operating a ring oscillator with RC time constants in respective stages of the ring oscillator and generating an oscillator output signal, the RC time constants being adjustable;
    dividing the oscillator output signal to generate a divided oscillator signal;
    asserting a load signal responsive to assertion of an enable signal and a transition of the divided oscillator signal, the enable signal allowing the ring oscillator to oscillate;
    loading a starting count value corresponding to a desired frequency into a counter responsive to the load signal;
    counting down the starting count value during a period of the divided oscillator signal to determine if the ring oscillator is oscillating above or below the desired frequency;
    if a count value of the counter goes to zero before an end of the period of the divided oscillator signal as indicated by a first value of a carry-out bit of the counter, thereby indicating an oscillation frequency of the ring oscillator is above the desired frequency, increasing the RC time constants to decrease the oscillation frequency of the ring oscillator, wherein after reaching zero the count value staying at zero during the period of the divided oscillator signal;
    if the count value is non-zero at the end of the period of the divided oscillator signal as indicated by a second value of a carry-out bit of the counter, thereby indicating the oscillation frequency is below the desired frequency, decreasing the RC time constants to increase the oscillation frequency of the ring oscillator;
    adjusting the RC time constants until the oscillation frequency of the ring oscillator is at the desired frequency, the RC time constants having a final value when the oscillation frequency is at the desired frequency; and
    adjusting another RC time constant in another circuit based on the final value of the RC time constants.

2. The method as recited in claim 1 further comprising:
    adjusting one or more variable capacitors in the respective stages of the ring oscillator to adjust the RC time constants.

3. The method as recited in claim 1 further comprising:
    adjusting one or more variable resistors in the respective stages of the ring oscillator to adjust the RC time constants.

4. The method as recited in claim 1 further comprising:
    wherein inverters contribute two percent or less delay through the ring oscillator at nominal values of the RC time constants.

5. The method as recited in claim 1 further comprising adjusting a capacitor forming a part of the other circuit to adjust the other RC time constant.

6. The method as recited in claim 1, wherein the other circuit is a filter or a delta-sigma modulator.

7. The method as recited in claim 1 further comprising performing the calibration operation at power up of an integrated circuit on which the ring oscillator and the other circuit are disposed.

8. An integrated circuit comprising:
    a ring oscillator including an odd number of inverter stages, each inverter stage including,
        an inverter; and an RC circuit having an RC time constant that is adjustable;

a divider to divide an output signal of the ring oscillator and provide a divided ring oscillator signal;

a counter to load an initial count value corresponding to a desired oscillation frequency and to count down the initial count value for a period of the divided ring oscillator signal;

wherein if a count value of the counter goes to zero before an end of the period of the divided ring oscillator signal, thereby indicating an oscillation frequency of the ring oscillator is above the desired oscillation frequency, the RC time constant of each inverter stage is increased to decrease the oscillation frequency of the ring oscillator, and wherein after reaching zero, the count value stays at zero during the period of the divided ring oscillator signal;

wherein if the count value is non-zero at the end of the period of the divided ring oscillator signal, thereby indicating the oscillation frequency is below the desired oscillation frequency, the RC time constant of each inverter stage is decreased to increase the oscillation frequency of the ring oscillator;

wherein the RC time constant of each inverter stage is adjusted until an oscillation frequency of the ring oscillator is at a desired oscillation frequency; and a second circuit independent of the ring oscillator and having a variable circuit parameter calibrated based on adjustments made to the RC time constant of each inverter stage to achieve the desired oscillation frequency.

9. The integrated circuit as recited in claim 8, wherein the variable circuit parameter is another RC time constant.

10. The integrated circuit as recited in claim 8 further comprising:
one or more variable capacitors in the RC circuit that are adjustable to adjust the RC time constant.

11. The integrated circuit as recited in claim 8 further comprising:
one or more variable resistors in the RC circuit that are adjustable to adjust the RC time constant.

12. The integrated circuit as recited in claim 8 wherein, delay due to the RC time constant in each of the inverter stages dominates delay due to active elements in each of the inverter stages.

13. The integrated circuit as recited in claim 8, wherein the ring oscillator and the second circuit are calibrated responsive to a power on condition.

14. The integrated circuit as recited in claim 8,
wherein the ring oscillator is coupled to an enable signal that allows the ring oscillator to oscillate responsive to the enable signal being asserted; and
wherein a load signal is asserted to load the initial count value into the counter responsive to the enable signal being asserted and a transition of the divided ring oscillator signal.

15. The integrated circuit as recited in claim 8,
wherein the count value going to zero before the end of the period of the divided ring oscillator signal is indicated by a first value of a carry-out bit of the counter and the count value being non-zero at the end of the period of the divided ring oscillator signal is indicated by a second value of the carry-out bit of the counter.

16. An integrated circuit comprising:
a ring oscillator including a plurality of inverting stages having programmable capacitor circuits disposed in each of the inverting stages, the ring oscillator supplying an oscillator output signal;

wherein the ring oscillator is coupled to an enable signal that allows the ring oscillator to oscillate responsive to the enable signal being asserted;

a calibration controller to measure an oscillation frequency of the oscillator output signal and to adjust the programmable capacitor circuits until the oscillation frequency is at a desired oscillation frequency, the calibration controller supplying the enable signal, the calibration controller including,
a divider to divide the oscillator output signal of the ring oscillator and provide a divided ring oscillator signal;
a counter to load an initial count value corresponding to the desired oscillation frequency and to count down the initial count value for a period of the divided ring oscillator signal;
wherein a load signal is asserted to load the initial count value into the counter responsive to the enable signal being asserted and a transition of the divided ring oscillator signal;

a functional circuit independent of the ring oscillator and having a variable capacitor circuit; and wherein the variable capacitor circuit is calibrated based on adjustments made to the programmable capacitor circuits to achieve the desired oscillation frequency.

17. The integrated circuit as recited in claim 16, wherein the desired oscillation frequency is programmable.

18. The integrated circuit as recited in claim 16, wherein the functional circuit is a filter or a delta-sigma modulator.

19. The integrated circuit as recited in claim 16,
wherein if a count value of the counter goes to zero before an end of the period of the divided ring oscillator signal, thereby indicating the oscillation frequency is above the desired oscillation frequency, the calibration controller increases capacitance of the programmable capacitor circuits to decrease the oscillation frequency of the ring oscillator, and wherein after reaching zero the count value stays at zero during the period of the divided ring oscillator signal; and wherein if the count value is non-zero at the end of the period of the divided ring oscillator signal thereby indicating the oscillation frequency is below the desired oscillation frequency, the calibration controller decreases the capacitance of the programmable capacitor circuits to increase the oscillation frequency of the ring oscillator.

20. The integrated circuit as recited in claim 19, wherein the count value going to zero before the end of the period of the divided ring oscillator signal is indicated by a first value of a carry-out bit of the counter and the count value being non-zero at the end of the period of the divided ring oscillator signal is indicated by a second value of the carry-out bit of the counter.

* * * * *